(12) United States Patent
Liang et al.

(10) Patent No.: US 8,717,767 B2
(45) Date of Patent: May 6, 2014

(54) SERVER CABINET

(75) Inventors: An-Gang Liang, Shenzhen (CN); Fei Teng, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

(*) Notice: Subject to any disclaimer, the term of this patent is extended or adjusted under 35 U.S.C. 154(b) by 98 days.

(21) Appl. No.: 13/472,512

(22) Filed: May 16, 2012

(65) Prior Publication Data

US 2013/0148294 A1 Jun. 13, 2013

(51) Int. Cl.
| | |
|---|---|
| *H05K 5/00* | (2006.01) |
| *H05K 7/16* | (2006.01) |
| *H02B 1/01* | (2006.01) |
| *H02B 1/20* | (2006.01) |
| *A47K 10/00* | (2006.01) |
| *H02G 3/04* | (2006.01) |
| *H02G 3/00* | (2006.01) |

(52) U.S. Cl.
USPC ........... 361/725; 361/724; 361/825; 361/826; 211/26; 174/68.3; 174/100; 174/101

(58) Field of Classification Search
USPC .............. 361/724–727, 825, 826; 211/26; 312/223.1, 223.2; 174/68.3, 100, 101, 174/50
See application file for complete search history.

(56) References Cited

U.S. PATENT DOCUMENTS

| | | | | |
|---|---|---|---|---|
| 6,347,714 | B1* | 2/2002 | Fournier et al. ................. | 211/26 |
| 7,119,282 | B2* | 10/2006 | Krietzman et al. ........... | 174/101 |
| 7,178,679 | B2* | 2/2007 | Canty et al. ..................... | 211/26 |
| 7,963,486 | B2* | 6/2011 | Wilson et al. .................. | 248/49 |
| 2006/0054336 | A1* | 3/2006 | McNutt et al. .................. | 174/50 |
| 2010/0264788 | A1* | 10/2010 | Adducci et al. ............ | 312/223.2 |

\* cited by examiner

*Primary Examiner* — Jayprakash N Gandhi
*Assistant Examiner* — Nidhi Desai
(74) *Attorney, Agent, or Firm* — Novak Druce Connolly Bove + Quigg LLP

(57) ABSTRACT

A server cabinet includes a housing and a number of cable management brackets longitudinally mounted to the housing. Each cable management bracket includes two opposite mounting portions mounted to the housing, and a base plate connected between the mounting portions. Each mounting portion defines a number of openings for cables extending through.

10 Claims, 5 Drawing Sheets

SERVER CABINET

BACKGROUND

1. Technical Field

The present disclosure relates to a server cabinet.

2. Description of Related Art

Switches are generally mounted on a top of a server cabinet; and a plurality of servers is mounted in the cabinet, below the switches. A plurality of cables is provided for connecting the switches and servers. However, due to the large number of cables, it is often difficult to manage the cables in a neat way.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
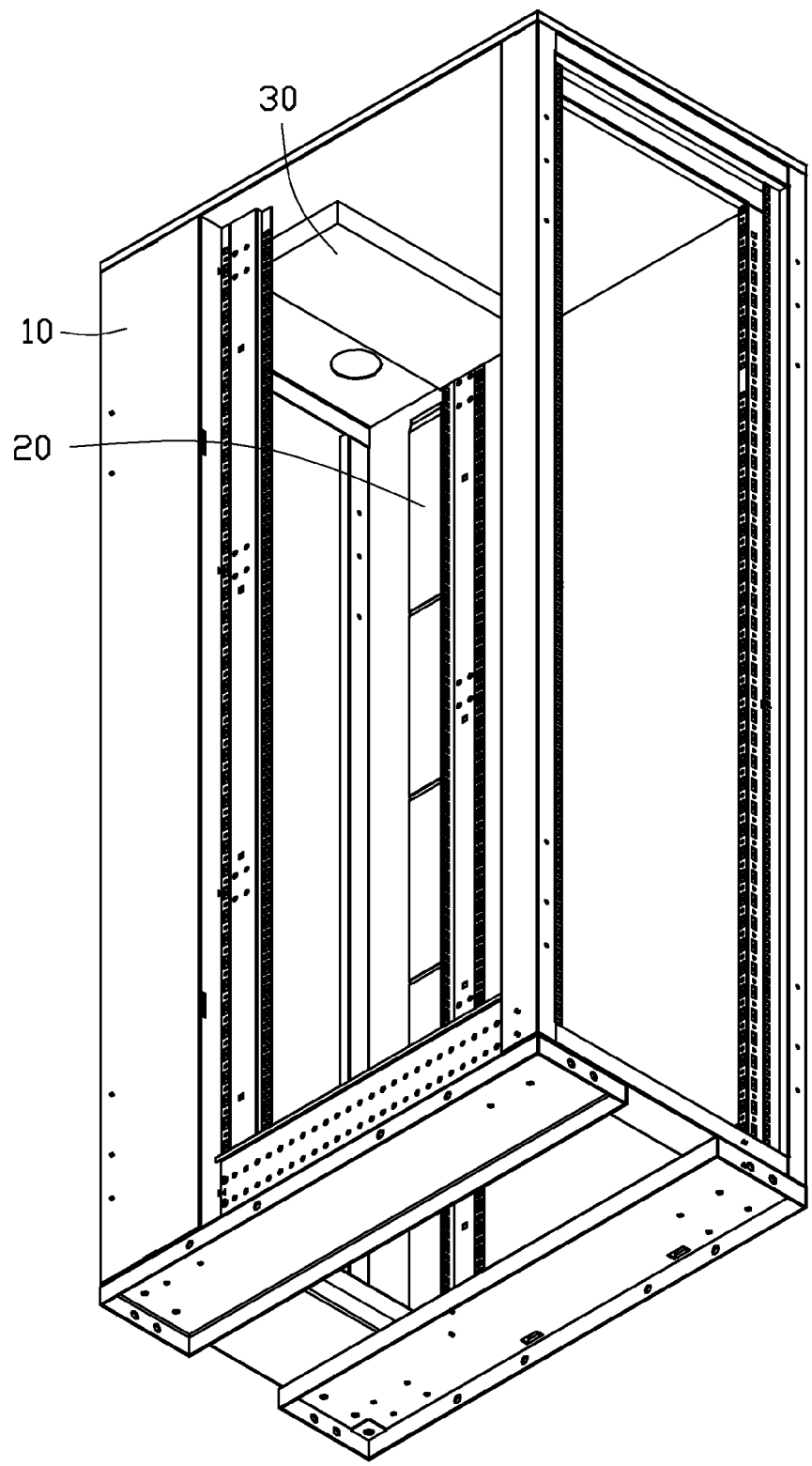
FIG. 1 is an assembled view of an exemplary embodiment of a server cabinet.
Figure 2:
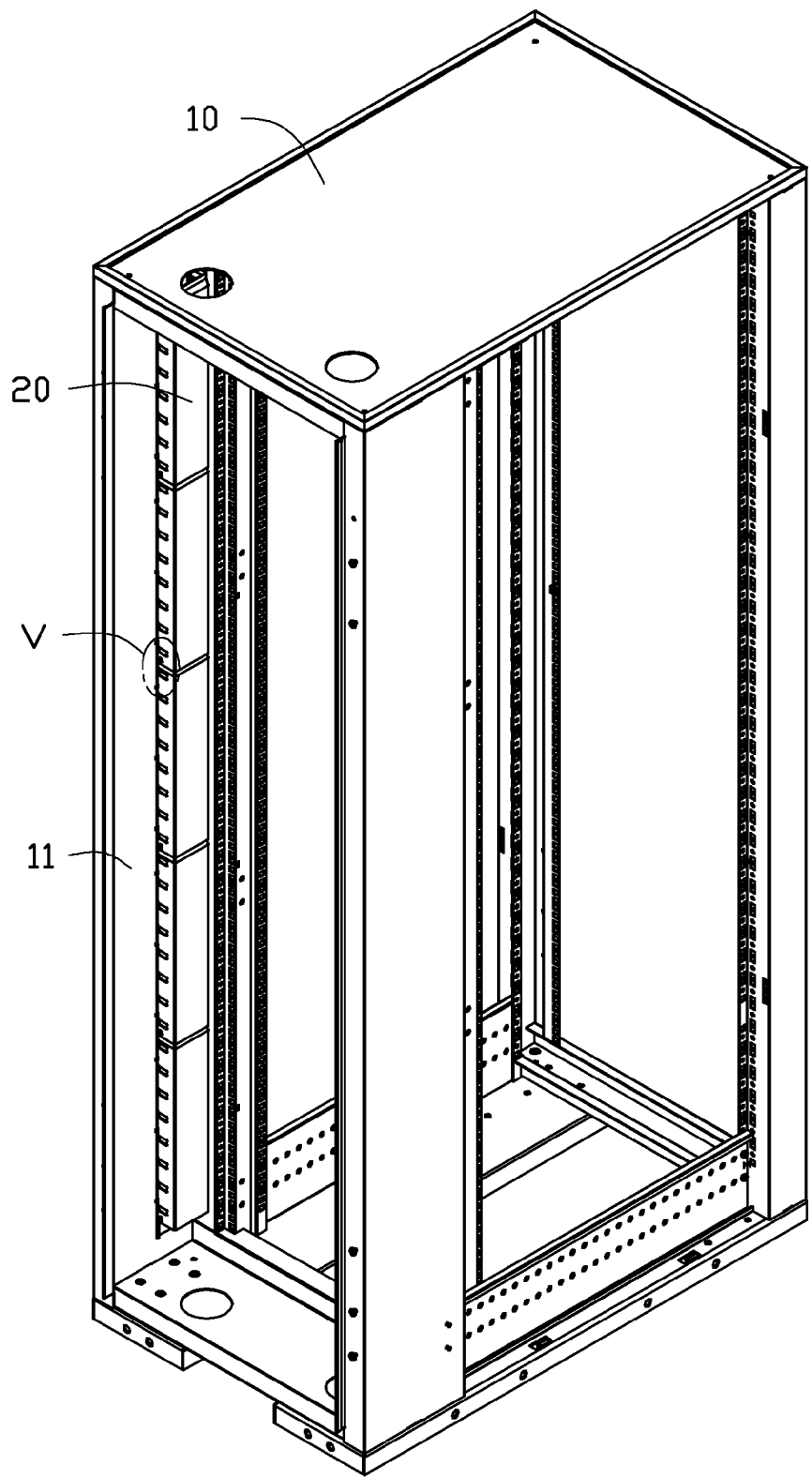
FIG. 2 is similar to FIG. 1, but viewed from a different perspective.
Figure 3:
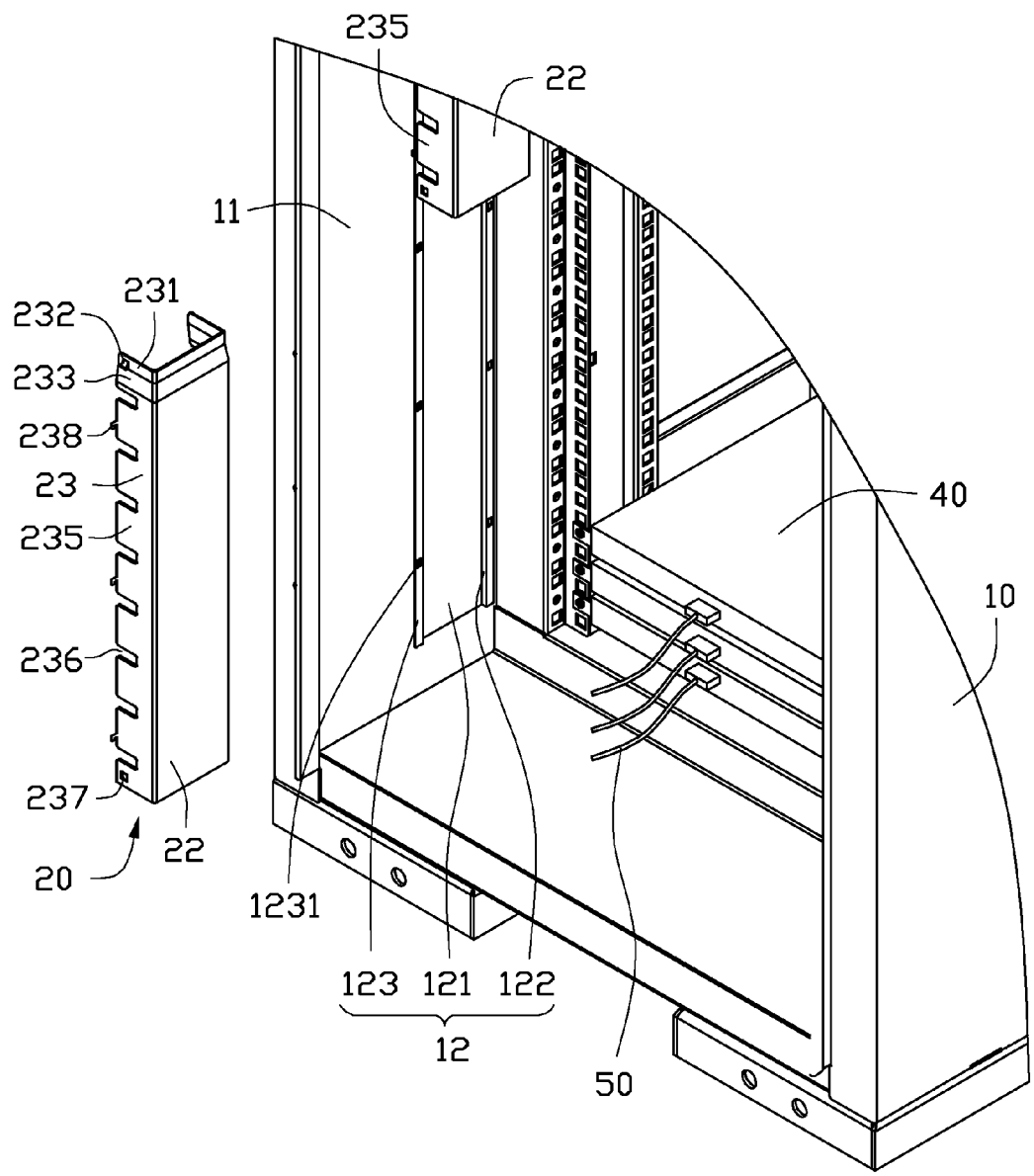
FIG. 3 is a partially exploded, isometric view of the cabinet of FIG. 2, wherein the cabinet includes a plurality of cable management brackets.

FIGS. 1-3 show an exemplary embodiment of a server cabinet including a housing 10 and a plurality of cable management brackets 20.

A switch 30 is mounted on an inner surface of a top of the housing 10. A plurality of servers 40 is mounted in the housing 10 from top to bottom, below the switch 30. The housing 10 includes a side plate 11 to enclose the servers 40. An elongated mounting bracket 12 is longitudinally mounted on an inner surface of the side plate 11, located behind the switch 30 and the servers 40. The mounting bracket 12 includes a fastening plate 121 fastened to the side plate 11, two connection plates 122 perpendicularly extending from opposite sides of the fastening plate 121 away from the side plate 11, and two mounting plates 123 perpendicularly extending from sides of the corresponding connection plates 122 opposite to the fastening plate 121, away from each other. A plurality of spaced through slots 1231 is longitudinally defined in each mounting plate 123.

Figure 4:
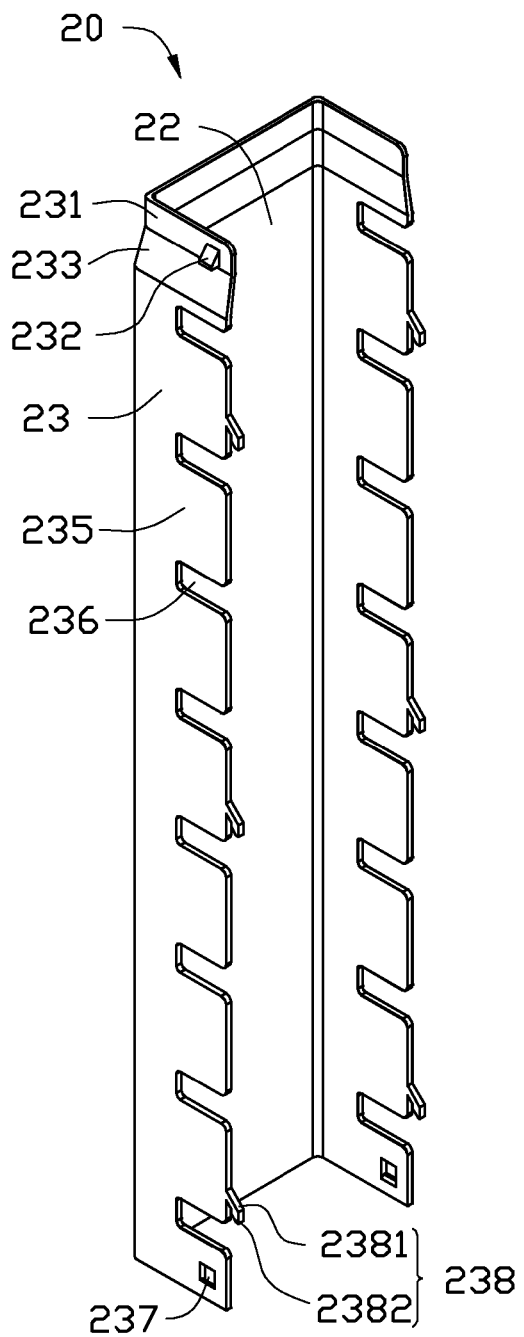
FIG. 4 is an enlarged view of one of the cable management brackets of FIG. 3, but viewed from a different perspective.

FIG. 4 shows each cable management bracket 20 including an elongated base plate 22, and two side plates 23 substantially perpendicularly extending from opposite sides of the base plate 22. Each side plate 23 includes a connecting portion 231 formed on a top end of the side plate 23, a slanting tab 233 extending slantingly and outward from a bottom of the connecting portion 231, and an elongated mounting portion 235 extending down from a bottom of the slanting tab 233. A substantially wedge-shaped latch 232 protrudes from an outer surface of each connecting portion 231. A vertically arrayed plurality of spaced openings 236 is defined in each mounting portion 235. Each opening 236 extends through a side of the corresponding mounting portion 235 away from the base plate 22. The distance between every two neighboring openings 236 of each mounting portion 235 is approximately the same as the height of the server 40. A hooking slot 237 is defined in a lower portion of each mounting portion 235, located below all the openings 236. Three hooks 238 extend from the side of each mounting portion 235, a first one of which is adjacent to the top of the mounting portion 235, a second one of which is adjacent to the bottom of the mounting portion 235, and a third one of which is on a middle of the mounting portion 235. Each hook 238 includes an extension portion 2381 extending slantingly and downward from the mounting portion 235 and an engaging portion 2382 extending down from a bottom of the extension portion 2381.

Figure 5:
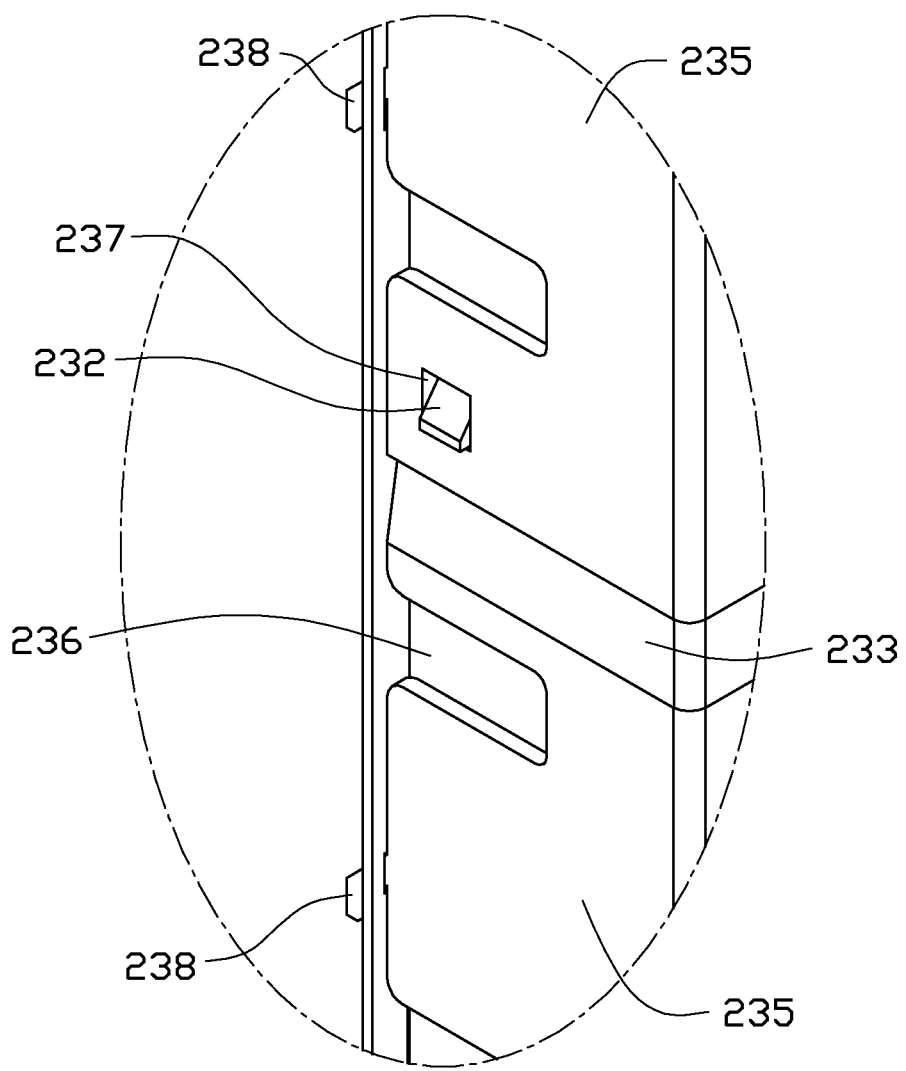
FIG. 5 is an enlarged view of a circled portion V of FIG. 2.

FIGS. 3 and 5 show in assembly, the engaging portions 2382 of one of the cable management brackets 20 extending through the corresponding through slots 1231. The cable management bracket 20 is then manipulated down, to allow the engaging portions 2382 to engage with side surfaces of the corresponding mounting plates 123 facing the side plate 11. The connecting portion 231 of an adjacent cable management bracket 20 is enclosed by the lower portion of the assembled cable management bracket 20. The latches 232 of the adjacent cable management bracket 20 engage in the corresponding hooking slots 237 of the assembled cable management bracket 20 from an inner side of the assembled cable management bracket 20. The hooks 238 of the adjacent cable management bracket 20 engage with the corresponding mounting plates 123, using the same manner described above. Identically, the other cable management brackets 20 are mounted to the mounting bracket 12, from top to bottom. Each server 40 corresponds to two corresponding openings 236 of the side plates 23 of the corresponding cable management bracket 20.

Each cable 50 connected to a rear side of a corresponding server 40 extends through a corresponding opening 236 of one of the mounting portions 235 of a corresponding cable management bracket 20, and extends up along the cable management brackets 20 to be connected to a rear side of the switch 30.

In other embodiments, the connecting portions 231 with the latches 232 and the slanting tab 233 are omitted. The neighboring cable management brackets 20 are not connected to each other.

Even though numerous characteristics and advantages of the embodiments have been set forth in the foregoing description, together with details of the structure and the functions of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A server cabinet, comprising: a housing; and a plurality of cable management brackets mounted to the housing, each cable management bracket comprising two opposite mounting portions mounted to the housing and a base plate connected between the mounting portions, each mounting portion defining a plurality of openings for cables to extend through; wherein the housing comprises a side plate, a mounting bracket is mounted on an inner surface of the side plate, the mounting bracket includes a fastening plate fastened to the side plate, two connection plates extending from opposite sides of the fastening plate away from the side plate, and two mounting plates extending from sides of the connection plates opposite to the fastening plate and away from each other, a plurality of through slots is longitudinally defined in each mounting plate, a hook extends from each mounting portion to detachably engage in the corresponding through slot.

2. The server cabinet of claim 1, wherein each hook comprises an extension portion slantingly extending down from the corresponding mounting portion to extend through the corresponding through slot, and an engaging portion extending down from a bottom of the extension portion to engage with a side surface of the corresponding mounting plate facing the side plate.

3. The server cabinet of claim 1, wherein a pair of latches protrudes from a top of each cable management bracket and a pair of hooking slots is defined in a bottom of the cable management bracket, the latches of each management bracket are engaged in the corresponding hooking slots of a neighboring cable management bracket.

4. The server cabinet of claim 3, wherein a slanting tab extends slantingly upward from a top of each mounting portion, a connecting portion extends up from a top of the slanting tab, each latch protrudes from a corresponding connecting portion, each hooking slot is defined in a lower portion of the corresponding mounting portion.

5. The server cabinet of claim 1, wherein a switch is mounted on a top of the housing, a plurality of servers is mounted in the housing below the switch, the cables connect the servers and the switch.

6. The server cabinet of claim 5, wherein a distance between the neighboring openings of each mounting portion is the same as a height of a corresponding server.

7. A server cabinet comprising: a housing; and a cable management bracket mounted to the housing, the cable management bracket comprising two opposite mounting portions mounted to the housing, and a base plate connected between the mounting portions, each mounting portion defining a plurality of openings from top to bottom for cables to extend through; wherein the housing comprises a side plate, a mounting bracket is mounted on an inner surface of the side plate, the mounting bracket includes a fastening plate fastened to the side plate, two connection plates extending from opposite sides of the fastening plate away from the side plate, and two mounting plates extending from sides of the connection plates opposite to the fastening plate, away from each other, a plurality of through slots is longitudinally defined in each mounting plate, a hook extends from each mounting portion to engage in one of the through slots of a corresponding mounting plate.

8. The server cabinet of claim 7, wherein each hook comprises an extension portion extending slantingly and downward from the corresponding mounting portion to extend through the corresponding through slot, and an engaging portion extending down from a bottom of the extension portion to engage with a side surface of the corresponding mounting plate facing the side plate.

9. The server cabinet of claim 7, wherein a switch is mounted on a top of the housing, a plurality of servers is mounted in the housing, below the switch; the cables connect the servers and the switch.

10. The server cabinet of claim 9, wherein a distance between the neighboring openings of each mounting portion is the same as a height of a corresponding server.

* * * * *